United States Patent [19]

Quinn, Daniel J. et al.

[11] Patent Number: 4,685,998
[45] Date of Patent: Aug. 11, 1987

[54] PROCESS OF FORMING INTEGRATED CIRCUITS WITH CONTACT PADS IN A STANDARD ARRAY

[75] Inventors: Quinn, Daniel J., Carrollton; Wayne A. Mulholland, Plano; Robert H. Bond, Carrollton; Michael A. Olla, Flower Mound; Jerry S. Cupples, Carrollton; Ilya L. Tsitovsky, Farmers Branch; Barbara R. Mozdzen, Carrollton; Charles F. Held, The Colony; Linda S. Wilson, Pilot Point; Yen T. Nguyen, Grand Prarie, all of Tex.

[73] Assignee: Thomson Components - Mostek Corp., Carrollton, Tex.

[21] Appl. No.: 917,040

[22] Filed: Oct. 9, 1986

Related U.S. Application Data

[62] Division of Ser. No. 592,186, Mar. 22, 1984, abandoned.

[51] Int. Cl.⁴ .................. B44C 1/22; B29C 37/00; H01L 23/48; H01L 29/44

[52] U.S. Cl. .................. 156/633; 437/209; 437/827; 156/644; 156/653; 156/657; 156/659.1; 156/901; 357/70

[58] Field of Search .................. 29/576 S, 589, 577 C, 29/591, 827; 156/626, 627, 629, 633, 643, 644, 653, 657, 659.1, 901, 668; 357/69, 70; 361/406, 421

[56] References Cited

U.S. PATENT DOCUMENTS

| | | | |
|---|---|---|---|
| 3,698,074 | 10/1972 | Helda et al. | 29/589 X |
| 3,823,467 | 7/1974 | Shamash et al. | 29/580 |
| 3,838,984 | 10/1974 | Crane et al. | 174/52 PE |
| 4,510,017 | 4/1985 | Barber | 156/651 |
| 4,531,285 | 7/1985 | Lucas | 29/827 |

Primary Examiner—William A. Powell
Attorney, Agent, or Firm—Roland Plottel

[57] ABSTRACT

An integrated circuit chip includes a top layer of dielectric penetrated by conductive vias connecting electrical contacts within the integrated circuit proper to a network of electrical leads disposed on top of the dielectric layer; the network of leads, in turn, being connected to an array of contact pads adapted for simultaneous solder connection to a leadframe.

3 Claims, 9 Drawing Figures

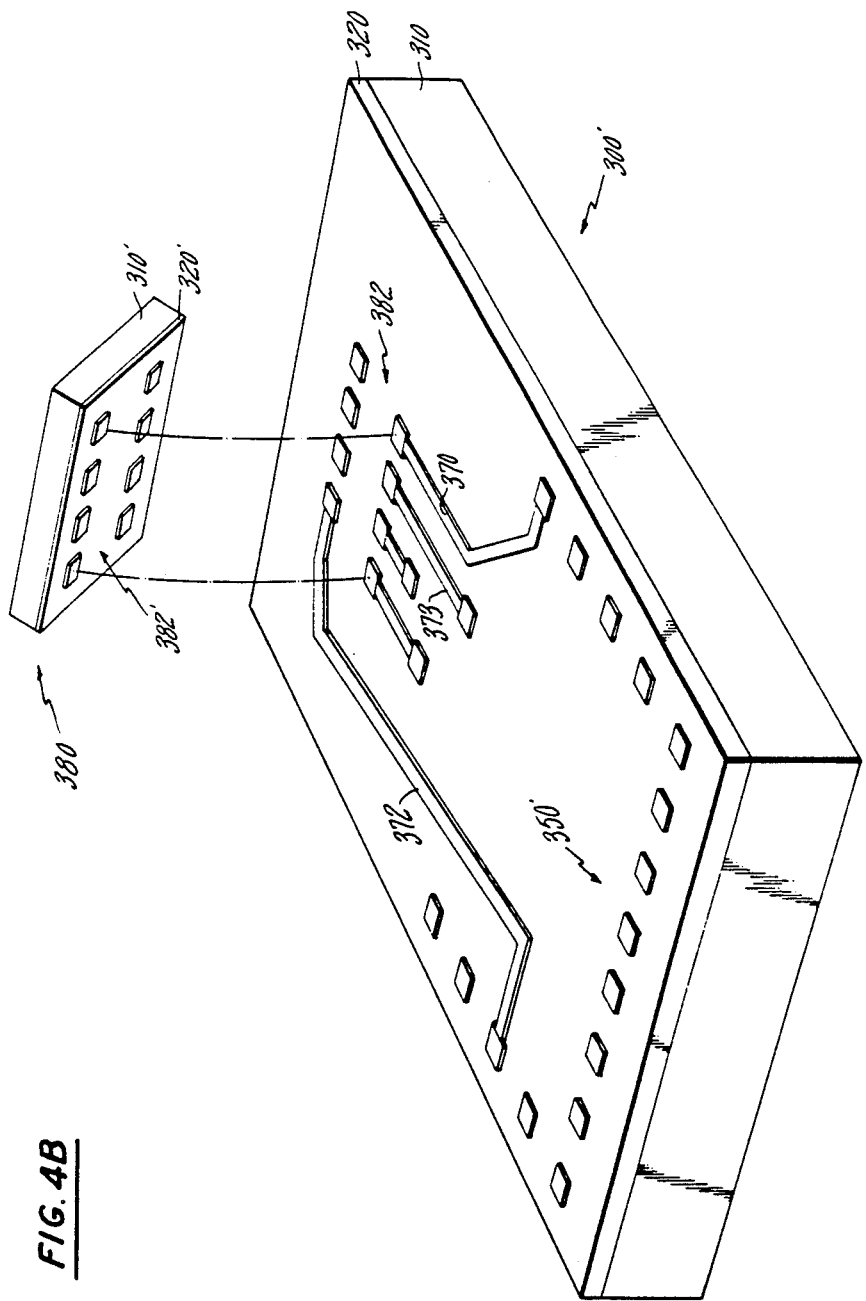

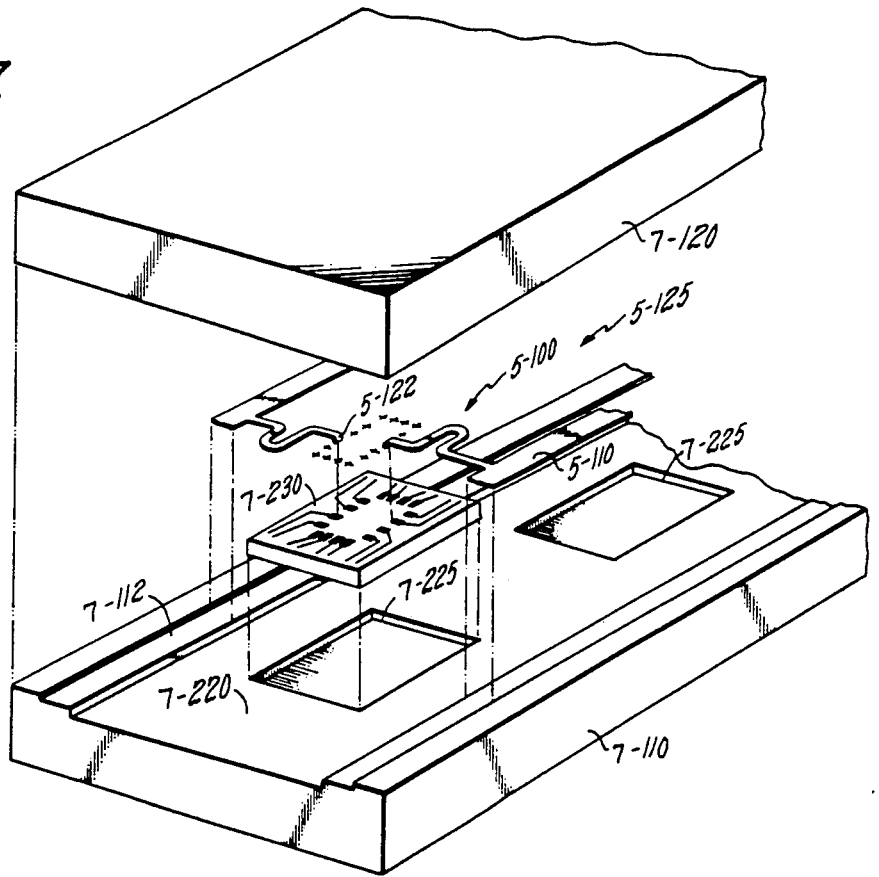

PROCESS OF FORMING INTEGRATED CIRCUITS WITH CONTACT PADS IN A STANDARD ARRAY

This application is a division of application Ser. No. 592,186, filed Mar. 22, 1984, now abandoned.

DESCRIPTION

1. Technical Field

The field of the invention is that of attaching leads to integrated circuit chips.

2. Background Art

The assembly operation for integrated circuits, sometimes referred to as the "back-end", consists of taking a silicon wafer containing several dozen or more integrated circuit chips; testing, sometimes referred to as "probing", the chips to determine which are working and which are not; cutting the wafer apart to produce individual chips; attaching the chip to a leadframe; bonding wires to the leads one at a time; and encapsulating the combination in plastic to provide protection for the device and cutting and forming the external leads of the leadframe to their final shape.

The standard method of attaching wires to the chip is by wire bonding, in which a gold or aluminum alloy wire is pressed very hard (in the presence of elevated temperatures and/or ultrasonic energy) against a pad on the chip until a bond is formed. One wire is done at a time. This method uses a great deal of labor and expensive materials. Automated wire bonding machines are known, but they have an inherent limitation. Even with the most rapid machines that can be imagined, there are factors that provide a necessary limitation to approximately 2,000 units per hour for a 16 pin chip. With wire bonding techniques, it is also necessary to attach the chip to the package or leadframe in order to maintain it in position while the wire bonds are formed. Also, the leads in this process must be typically made of an expensive expansion-controlled alloy in order to have the correct thermal expansion matching between the chip and the leads when gold-silicon eutectic die bonding is used or expensive special alloys or adhesives must be used to correct the thermal mismatch. Also, the leads must be plated with gold, silver or other precious metal so that the bonding wire can form a reliable connection to the lead.

One prior art method that provides for simultaneous lead soldering is the "flip-chip" method developed by IBM, in which a lump of solder is placed on the chip and the chip is soldered to a ceramic substrate that is attached to the leads. This IBM method does not have a layer of leads on the top of the chip.

DISCLOSURE OF INVENTION

The invention relates to an integrated circuit chip adapted for an automated method of assembling and encapsulating integrated circuit chips in which the chips have standard connections that are in the same position for a number of different models of chips; the leads are all attached at the same time (by a fusible alloy reflow bonding method); the leadframe is stamped from an inexpensive metal, such as copper, and the integrated circuit die is not attached to a support in an intermediate step.

Another feature of the invention is the routing of input and output leads carryng relatively high current over interior portions of an integrated circuit.

Another feature of the invention is the provision of a standard pad array used for different chips having the same number of pins, so that only one type of leadframe need be kept in inventory for each pin-family.

Yet another feature of the invention is the provision of a leadframe adapted for reliable formation of bonds simultaneously in an automatic process.

Yet another feature of the invention is the elimination of the need to control thermal expansion between the chip support and the chip.

Yet another feature of the invention is the provision of corrosion protection of the semiconductor metallization by a thick dielectric.

Yet another feature of the invention is the use of a single array of probe electrodes for testing a pin-count family of chips.

BRIEF DESCRIPTION OF DRAWINGS

FIGS. 4A and 4B illustrate alternative arrays of contacts.

FIG. 7 illustrates a carrier used to hold a leadframe and die during the bonding step.

BEST MODE FOR CARRYING OUT THE INVENTION

The present invention was developed together with other components of a system for assembling and testing integrated circuits. Other features of the system are the subject of co-pending patent applications, filed the same day herewith and assigned to the assignee hereof. In order to convey the invention in context, discussion of the overall system is included in this specification.

Figure 1:
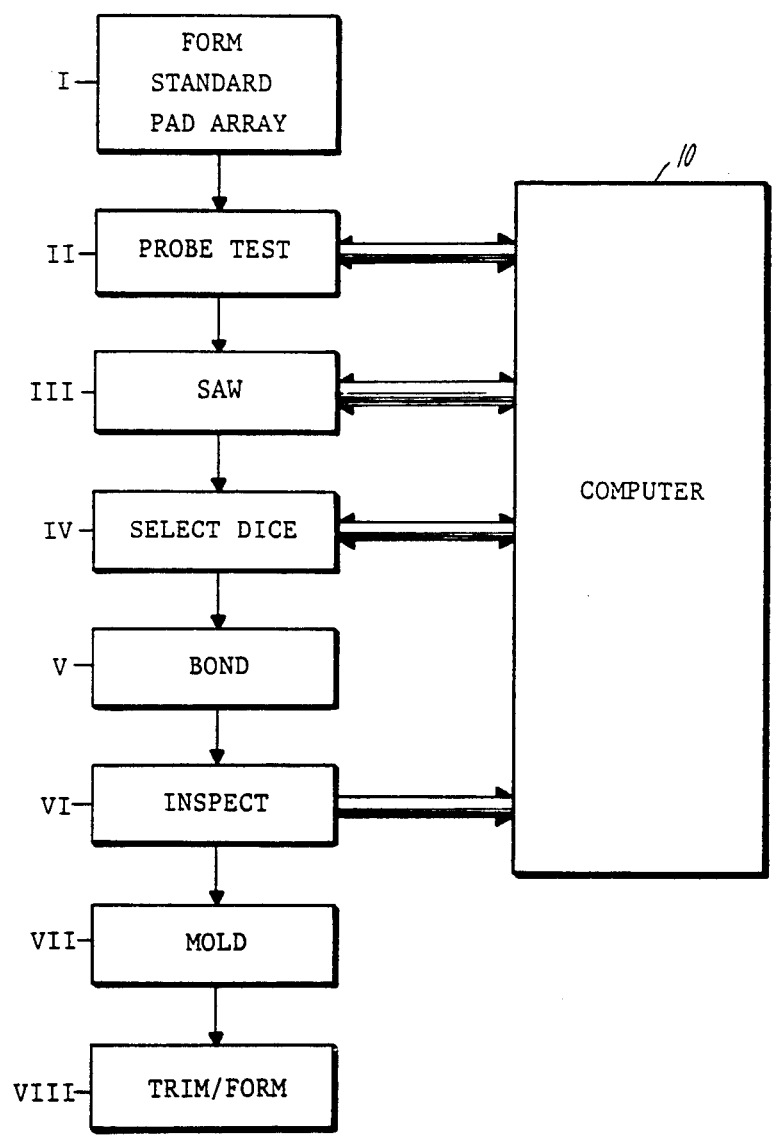
FIG. 1 illustrates the process flow in a system using the subject invention.

An overall flow chart of the steps used in the back-end assembly is illustrated in FIG. 1, in which a number of steps are illustrated schematically and are performed by a variety of different machines in communication with and sometimes controlled by a computer for storing test and other data.

In the first major step, represented by the box labelled I, a process that may be part of the "front-end" or the "back-end", accepts as input a wafer that has been completed with all the conventional steps (including passivation, etc.) and applies a further layer of dielectric having a thickness sufficient to protect the chip circuits and to insulate them electrically from signals being carried on the top surface of the dielectric.

A pattern of metal leads is formed that extends from the contact pads on the previous chip to a standard array of contact pads on the top of the dielectric. The standard array is the same for all chips having the same number of pins, regardless of the size of the chip die.

The wafer is then probe tested, in major step II with the results of the probe test being stored electrically, such as in a computer. The conventional ink-dot marking system for bad chips is not used.

The wafer is then adhesively mounted on an adhesive film in a frame holder that is shaped to allow for automatic insertion and orientation in various fixtures further along in the process and cut apart in an automatic sawing process (Step III) that cuts through the entire thickness of the wafer.

The good dice are then removed from the wafer in an automatic sequence (Step IV) that presses from above against the tape to selectively pick a die down into a dedicated carrier where it rests circuit side down. This is not a problem since the active circuitry is protected by the standard pad dielectric and standard pads. The wafer and punch-out device are moved under computer control to put the dice into the correct positions in the carrier.

The dice are transferred to a mating carrier simultaneously in an inversion operation that rotates the two-carrier "sandwich" by 180 degrees, so that the dice resting in the second carrier have contacts on the top side. A set of dice are transferred to a bonding fixture that holds a convenient number, illustratively 14 dice. Once loading is complete, a leadframe matching the spacing of the dice in the fixture is positioned above the dice in the soldering fixture and an upper bonding fixture is added to maintain lead to pad contact during the bonding process.

The bonding fixture is heated to reflow the solder and form the interconnection (Step V).

The leadframe with dice attached is placed in a transfer or injection molding machine that encapsulates the die together with the interconnections to the leadframe (Step VI).

The molded strip of devices is then trimmed and formed conventionally (Step VII).

There is a representation in FIG. 1 of data communication between the machines that perform the steps listed above and the controlling computer. Most data communication steps are optional. The step may indeed be performed under operator control and data may be written down manually. The benefits of automatic recording of data and error-free recall of data from a previous step will be evident to those skilled in the art.

The different steps of the invention are set forth in more detail below and in copending patent applications filed on the same date herewith and assigned to the assignee hereof.

Figure 2:
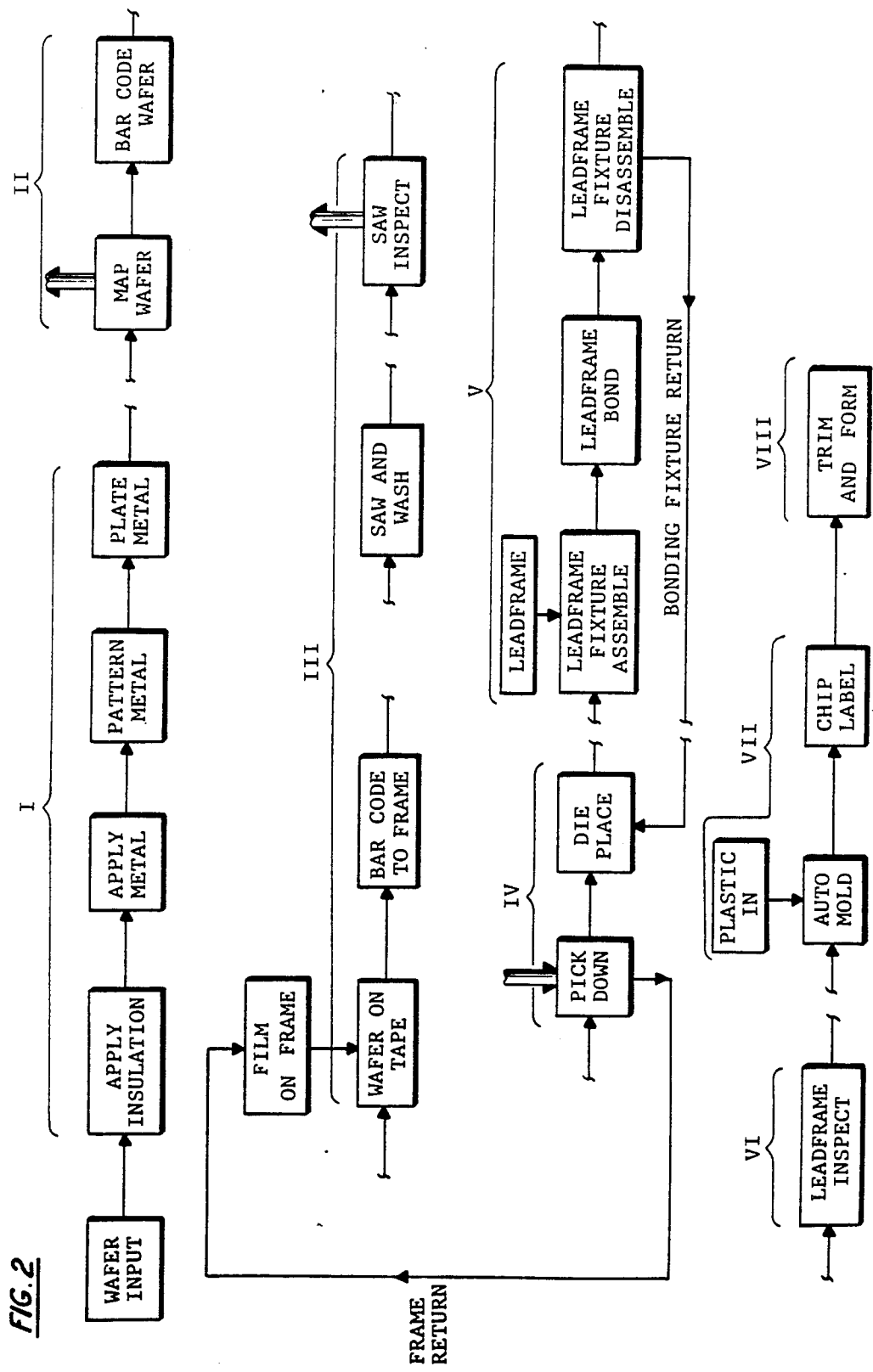
FIG. 2 illustrates the steps in FIG. 1 in more detail.

FIG. 2 sets out the steps in FIG. 1 in more detail and also illustrates the material and data flow. A convention used in this figure is that a broken line indicates a material transport step of the sort of loading the material into a container and moving the container to another location and a double arrow indicates data flow into or out of a computer or other storage device. The three material inputs to the process are the wafers, leadframes and plastic for encapsulation. Two recirculation loops involve, respectively, a frame used to support the wafers during the sawing and die selection steps and a positioning fixture used to maintain a set of dice in alignment with a leadframe segment during the bonding operation.

STANDARD CONTACT PADS

Figure 3A:
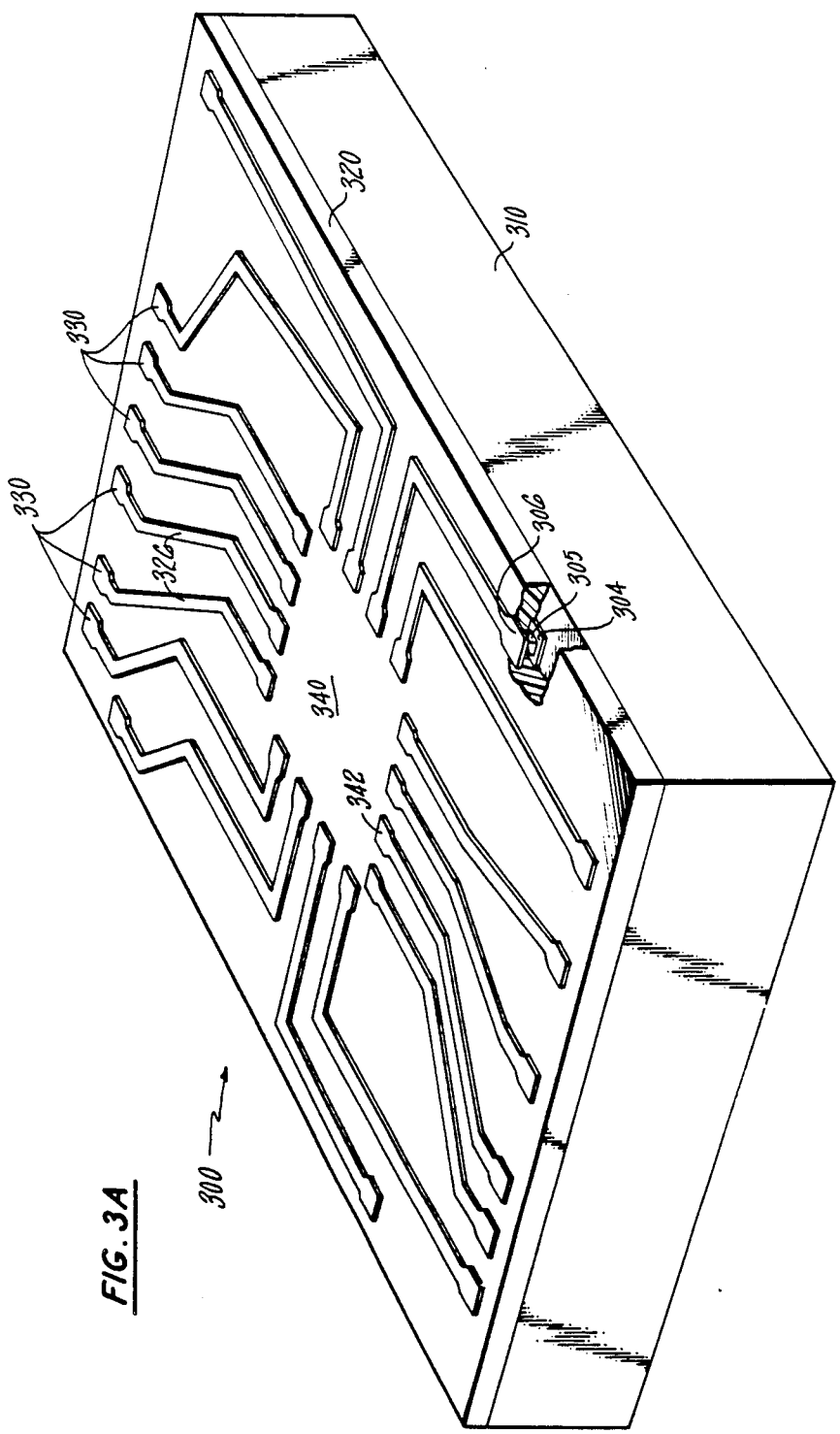
FIGS. 3A and 3B illustrate different forms of a chip used in the subject invention.

Returning to the first major step, an integrated circuit according to the invention is illustrated in FIG. 3A, in which integrated circuit 300 is any conventional integrated circuit with substrate, transistors and other active components, interconnections, passivation layer and the like, all indicated generally by the numeral 310. A protective isolating layer 320 serves to isolate the circuit below from electrical signals carried by the input and output leads as well as to provide physical and chemical protection for the circuit below. For example, protective layer 320 is chosen to provide a moisture-resistant seal as well as to provide electrical insulation.

The array of contact pads, indicated generally by the numeral 340, is located in the center of the die and has the same configuration for all dice that have the same pins count. Leads 326 extend from locations 330 at the edge of the die along paths that lead to array 340.

Illustrative dielectric layer 320 is a polyimide, such as Dupont 2525, applied with a thickness of 6 microns and cured at a temperature of greater than 260 degrees centigrade. There may be a nitride or other layer below the polyimide to improve adhesion to the reflow glass or other top layer. The electrical contact pads that have been previously formed in the integrated circuit chip by conventional processing techniques are exposed by applying a photoresist, either liquid or in the form of a tape, on top of the dielectric and etching down through it a passageway to the metal contact pad in the circuit in a conventional manner. A "via" will be formed by filling the contact holes with a metal or other conductor until the surface of the dielectric is reached. The photoresist is stripped off and a layer of metal is applied by any technique, such as sputtering, over the surface of the polyimide. In one example, the polyimide was back sputtered to prepare the surface, after which 600 Angstroms of 10% titanium +90% tungsten followed by 1000 Angstroms of copper and the titanium tungsten mixture sputtered simultaneously, followed by typically 3 microns of copper were sputtered on.

A second layer of photoresist is applied and patterned to define a set of metal leads in the metal layer. The leads reach from the vias penetrating the dielectric to an area in the center of the chip which has a standard pad array of pad contacts that is the same for all chips that have the same number of leads. For example, a 16 pin chip will have the same standard pad array, of size about 0.016" by 0.016" in a standard configuration having dimensions of 0.126" by 0.126", whether it is a memory or any other logic device. The standard pad array will be sized so that it fits on the smallest chip that is to be used with that leadframe. Optional versions of the invention employ a pad array that is arranged for some particular purpose.

The exposed areas of the metal are plated with a solder composed of a standard mixture of lead and tin in a conventional electrolytic plating process that employs a mixture of 95% tin and 5% lead. The photoresist is stripped and the plated areas of the metal layer are used as an etching mask in the next step in which the remaining unwanted area of the metal layer is etched away in a bath of hydrogen peroxide plus ammonium hydroxide followed by hydrogen peroxide, which does not attack the solder.

There now remains a chip 300 of the form illustrated in FIG. 3A, in which die 310 has on it a thick layer of polyimide 320 and a network of metal lines 326 leading from the contact areas 330 on the outside of the chip to the standard pad array 340. The metal lines 326 have lower inductance greater thermal conductivity and greater strength compared to the wires that were previously used.

In the example shown in FIG. 3A, the first contacts and the vias through the polyimide layer are all formed on the perimeter of the chip. The term "perimeter" is used to refer to the area near the edge of the chip that is used in the prior art for the contact pads. This figure illustrates a chip in which the layout design was made for the old wire-bonding method in which the contact areas had to be on the perimeter of the chip. An advantage of retaining the old design, besides saving the expense of a new layout, is that it is possible to use conventional wirebonding processes when added capacity is required. To do this however, requires that the additional dielectric and metallizations for the standard pad process is not used.

Figure 3B:
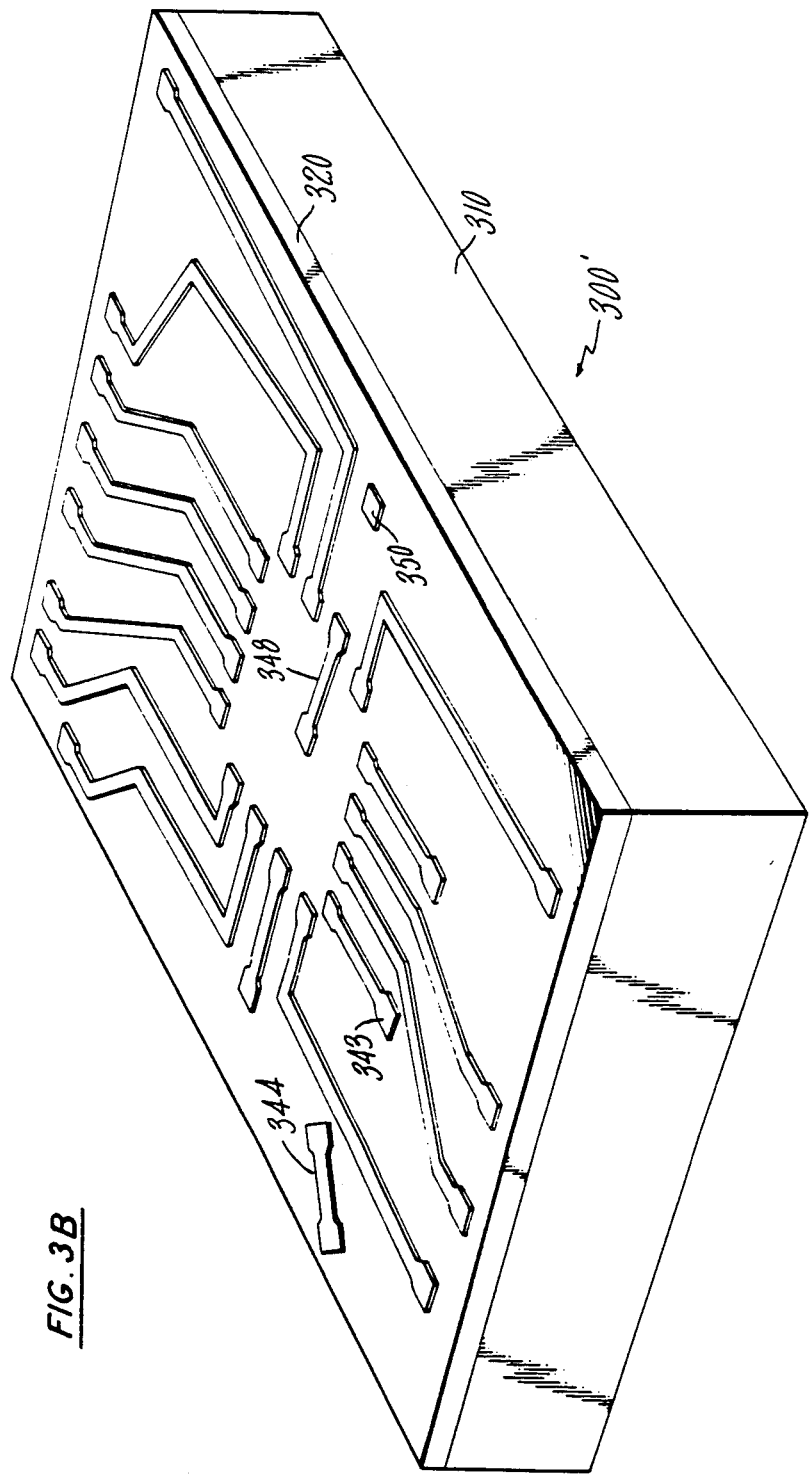

It is also possible to use the invention and put the contact areas through the dielectric at any convenient location, as shown in FIG. 3B. The vias for these leads are shown as originating at different locations on the chip surface, not exclusively at the edge as was the case in the prior art. Lead 348 is shown as connecting a via that is located within the standard pad array. Lead 343 is connected to a via-section 344 through a bridge, not shown in the drawing, that is placed on top of the passivation layer of the underlying chip below the polyimide. This illustrates an additional degree of freedom in routing leads and placing components that is provided by the invention.

A via 305 is shown in FIG. 3A in a cut-away portion of the figure as extending from a lower contact area 304 to an upper contact 306 at an end of one of leads 326. The lower contact pads in current practice are typically 4 mils by 4 mils. With such a large area to make contact, the alignment tolerance for the formation and location of the vias and the placement of leads 326 are typically ±2 mils to 3 mils, which is much greater than a typical tolerance of ±½ mil to 1 mil for connecting leads in the precision processes that are used with conventional wirebonding.

The steps of forming vias and putting down leads may be performed in the front-end using the standard machines for photolithography, if that is convenient. Since the requirements for putting down these metal leads are much less stringent in position alignment than the usual front-end work, it may be preferable to use thick-film technology, such as screen printing, to pattern the dielectric and top leads. Typically, the thick-film technique will be ¼ to ½ the cost of the precision techniques.

Figure 6:
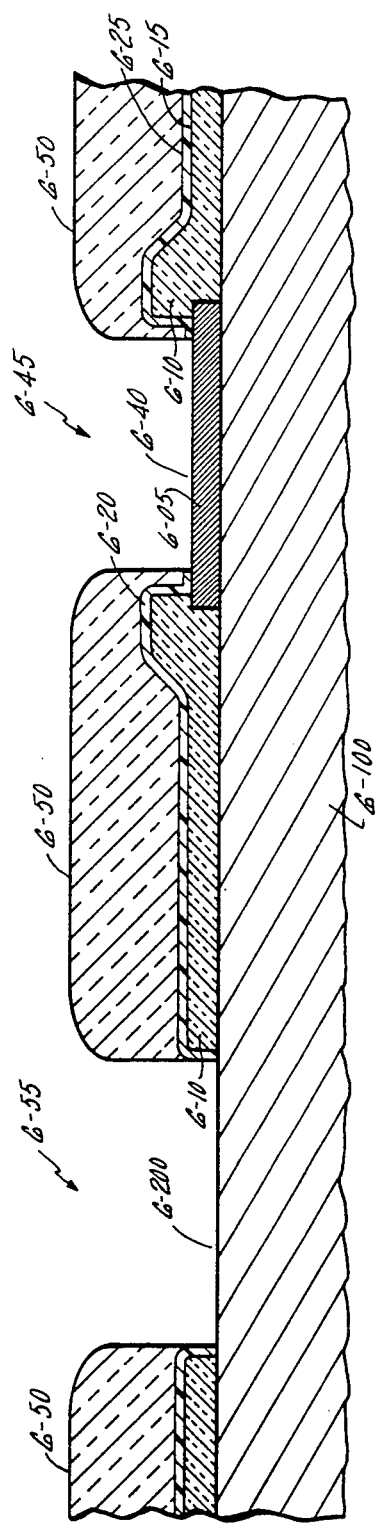
FIG. 6 shows a cross section of an integrated circuit chip suitable for use with the invention.

It has been found that the polyimide layer 320 of FIG. 3 does not adhere reliably if it is attached directly to the layer of oxide immediately below it. A cross section of a portion of a die is shown in FIG. 6, in which substrate 6-100 is the silicon substrate and aperture 6-55 is the "street" that separates adjacent dice. The width of a street is typically 100 microns, to allow room for the saw kerf in the separation step that is performed with a diamond saw having a width of 0.001 inch.

A contact pad, 6-05, is shown with a series of apertures defined above it. Pad 6-05, which is typically aluminum and is connected by metallization strips, not shown, to the rest of the circuit, is surrounded by oxide 6-10, which has a conventional composition of $SiO_2$ plus phosphorous and other additives and a thickness of 1 micron. Oxide 6-10 has a top surface 6-15 on which polyimide layer 6-50 was, at first, applied directly. Early tests showed significant difficulty, in that polyimide layer 6-50 (layer 320 in FIG. 3) often disbonded, causing the leadframe to pull the polyimide away from the underlying layer.

Oxide 6-10 functions as the top dielectric layer in the circuit. It not only coats the substrate and contacts, as shown in FIG. 16, but also the circuit elements and metallization.

Passivation of the active elements of the circuit is effected in the usual manner of silicon MOSFETS by the thin oxide 6-10 functions purely as a dielectric, not as a passivating layer.

Nitride layer 6-20 is deposited by plasma-assisted CVD at a temperature of 250° C., in a conventional manner, to a thickness of 0.3 micron after street 6-200 has been etched through oxide 6-10 to the substrate. A layer of 2525 polyimide from Dupont is applied and spun to produce a relatively flat top surface. Apertures 6-45 above contact 6-05 and 6-55 above street 6-200 are opened through the uncured polyimide by wet etching with a conventional basic solution such as Shipley 312 developer. Typical dimensions for the top of aperture 6-55 and 6-45 are 100 and 87 microns, respectively. After aperture 6-45 has been opened, aperture 6-40 is opened through nitride layer 6-20 by plasma etching in CF4. A typical dimension of aperture 6-40 is 75 microns, so that aperture 6-40 is surrounded by nitride 6-20 and does not expose any of oxide 6-10.

It has been found that the adhesion of polyimide to top surface 6-25 of nitride 6-20 is greatly improved over the adhesion of polymide to oxide 6-10 at surface 6-15. Nitride 6-20 adheres well to oxide at surface 6-15. The function of nitride 6-20 is thus to improve the adhesion of the polymide by means of a structure that totally encloses the oxide 6-10, not only at the vias but also at the saw cuts on the streets.

PROBE TEST

The next major step II is a test with the individual circuit dice still remaining in the wafer. A conventional wafer electrical test step could be performed in which small probes are attached to the contacts that will be used for the input/output and the individual chips are tested. An advantage of this invention is that the metal leads on top of the polyimide cover a much larger area than the old-style contact pads do, so that it is easier to make electrical contact at reduced pressure of the electrical contact probe or electrode with these large metal pads than it is with the small contact pads used in conventional techniques. It is also possible to make electrical contact to the leads before you reach the contact area, thus providing additional flexibility in the probe step. An important economic benefit from the invention is that only a single set of probe tips will be needed to match the standard pad array for the whole family of circuits that have the same number of pins. In the prior art, a different set of probe tips was typically needed for each chip design.

If the chip has optional electric contact pads outside the standard pad array, as shown by contact 350 in FIG. 3B (which is a via formed to provide access to a point in a circuit that is to be tested, yet does not connect to one of the regular contacts), then a different set of probe pins will be needed in that case, of course.

In conventional wafer tests, defective chips are marked by a small dot of ink so that, in manual assembly, they can be identified and discarded. In this process, the chips are identified electrically—i.e. the wafer is oriented in a particular way and the chips are identified by their locations in an X-Y matrix. The test data for individual chips are stored in the central computer memory or in a floppy disk or other storage medium and defective chips are identified in the computer. This step is referred to in FIG. 2 as wafer mapping.

If the chip has the feature of redundant or optional circuits that are connected or disconnected by blowing fuses by a laser (as is done in large scale memory arrays), then this step will have been done before the polyimide layer is put down, as is currently being done. It is possible, however, to provide for the enabling or disabling of optional subcircuits or the enabling of redundant circuits to be done electrically by means of access through additional contacts (similar to contact 350) that are placed through the polyimide layer outside of the metal strips, or by putting down the polyimide with a large opening over the redundant circuits that will be closed later. In that case, the central computer would identify optional circuits that are to be enabled or disabled and blow fuses appropriately through the test probes. The point in the sequence at which fuse-blowing is to be done is optional, of course.

If the wafers have not been given an identifying label before, it is now necessary to put a label on them in order to maintain the connection between the test data stored in the computer and the wafer the data came from. There are many ways of doing this correlation, of course, and no particular method is required. One preferred method is to put the identification on an identifying label, such as an optical bar code, that identifies the wafer. Another method is to form a programmable memory in the wafer in which the identities of defective chips may be stored. In that case, the wafer carries with it the necessary information so that there is no problem of getting the wafer separated from the test results.

The steps of sawing apart the dice and then selectively removing good dice by automatic processes are described in more detail in copending patent applications. These steps may be performed manually, rather than automatically, if the increased production rate afforded by automatic die selection is not required for some particular application.

BOND

The assembly for the final bonding step (Step V in FIG. 1 and Leadframe Fixture Assemble, Bond, Disassemble in FIG. 2) is shown in an exploded view in FIG. 7, in which holder 7-110, represented schematically, holds 14 chips with the correct spacing, only two of the receptacles 7-225 being shown. Above receptacle 7-225, there is positioned chip 7-230 and, above the chip, a set of finger contacts 5-122 in leadframe 5-100, part of leadframe strip 5-125. The details of the leadframe will be described below. Cover 7-120 presses down on edge 5-110 of leadframe strip 5-125, which edges rest on shelves 7-112 to position the outer parts of the strip so that the contact tips will be deflected slightly. This deflection is done to compensate for inevitable fluctuations in the position of the tips durng the manufacturing process, so that reliable contact is ensured during the bonding operation. The deflection is effected by making the depth of receptacle 7-225 such that the top of chip 7-230 projects above the plane of shelves 7-112 by a set amount. The amount of deflection, (0.005 inch to 0.007 inch) is illustratively several standard deviations of the nominal fluctuation of the tip position to ensure reliable joint formation. The edges 5-110 of leadframe strip 5-125 will be forced on to shelves 7-112 by cover 7-120 and tips 5-122 will thus be pressed against the pads by the spring constant of the leads.

Figure 5:
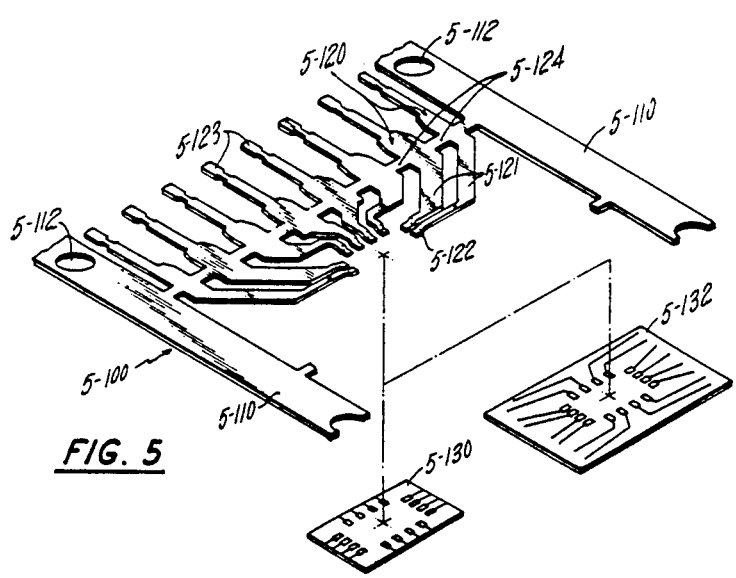
FIG. 5 illustrates a portion of a leadframe.

A typical leadframe used in the invention is illustrated in FIG. 5, in which half of an individual frame is shown. The individual leadframes are stamped out of a ribbon of metal that may be an inexpensive copper alloy, in contrast to the expensive alloy having the correct thermal properties that is used in the standard prior art process. For purposes of this applicatin, the leadframe will be referred to as being 'metallurgically continuous' in order to distinguish it from the prior art, in which a relatively thick frame is connected to a chip by a thin wire, so that the prior art electrical connection changes size and shape as well as composition. The use of solder does not affect whether a leadframe is metallurgically continuous. Strips 5-110 on either side of the ribbon serve to carry the actual leads 5-120 along. Leads 5-120 have an exterior end 5-123, shaped for insertion in a socket or for surface-mounting, and an interior portion 5-121 for attachment to a die. The two portions are joined by segments 5-124 that will be severed after the bonding step. Holes 5-112 are provided to give a reference in positioning the leadframe. At the end of each lead 5-120, there is a region, 5-122, in which the lead is bent in a quarter circle (or bent twice to form a parallel contact section) to form a standard dimension flat contact area. Each of the different leads 5-120, with its different length, has been shaped to provide substantially the same spring constant so that the contact areas 5-122 will be uniformly pressed against the mating pads on the die to give correct alignment for the soldering operation. The leads 5-120 have been tinned with solder in a previous step in the fabrication of the leadframe ribbon.

Both the contact pads 342 of the die and the tips 5-122 have been tinned and are ready to be heated. The bonding is done by a vapor phase reflow soldering technique or other means of heating the materials to reflow the fusible alloys. These alternative techniques include infra-red heating, conveyor ovens, hot gas heating or laser heating. In vapor phase reflow, a liquid such as Flourinert FC-71 is maintained at its boiling point, the liquid having been selected so that its boiling point is above the soldering temperature. The soldering assembly of holders 7-110 and 7-120, with chips plus leadframe maintained in alignment, is inserted into a container or oven that is filled with the vapor at the boiling-point temperature and held there until the solder has melted and flowed to form a bond. A typical length of time for the heating cycle is 5 to 15 seconds. This boiling point temperature is typically above 225 degrees C. but below 300 degrees C. In contrast, the present wire bonding and die attach steps are performed at temperatures of up to 460 degrees C. and performed individually. In order to reduce the length of the heating cycle, the bonding fixture should have low mass and many apertures to permit the vapor to flow freely about the solder joints. Holders 7-110 and 7-120 have been shown schematically in order to reduce the complexity of the drawing.

It is not necessary that all the lead tips 5-121 be used in a system. If there are unnecessary leads and it is desired to use a standard leadframe, the extra lead tips 5-122 may be connected to dummy contacts in standard array 340 or simply rest on polyimide 320.

An important economic benefit of this invention is that all the leads are soldered at the same time. This is in contrast to the wire-bonding technique, in which the leads must be bonded one by one. The soldering step takes no longer for a 28 pin chip than it does for a 16 pin chip.

MOLD

In the next major step, (Step VII in FIG. 1), leadframe 5-100, with 14 chips attached, is placed into a transfer or injection molding machine to mold plastic about it, thus encapsulating and protecting the chip.

The molding process will be done using conventional techniques and equipment. It is an advantageous feature of this invention that the wide contact area between the leadframe and the contact pads is extremely rugged compared to the wire bonding technique that is in standard use so that a far smaller fraction of chips will be damaged during handling and the chips can be moved about at a greater rate and with less delicacy required. It is a further advantage that the leads conduct heat away from the chip during operation.

After the encapsulated dice, (still in the leadframe) are removed from the molding machine, the optional labelling step of FIG. 2 is performed. The dice identity first appeared during probe test, when data were measured that applied to an individual die. That identity was preserved by the labels on the wafer, tape frame and leadframe, the computer being updated as required to log the die identity on the leadframe. Each chip may be marked by a laser branding process or any other convenient technique with an identifying label, test results, etc.

The conventional "dejunk" step, in which excess plastic is removed from the leads is also performed at this time.

TRIM/FORM

Next, in step VIII of FIG. 1, the chip plus leadframe combination is separated from the ribbon and the spacing segments 5-124 that served to maintain the leads in correct alignment are severed. If the ribbon is formed from a sheet of copper or copper alloy, it is necessary to sever the connections 5-124 or else all the leads will be shorted together. If another version of the ribbon is used, in which a plastic backing is used for the portion 5-110 and to support leads 5-120, on top of which a plated copper lead has been formed, then it will be easy to maintain the sections 5-124 in plastic and it is not necessary to separate the leads.

DISCRETE COMPONENT ATTACHMENT

Figure 4A:
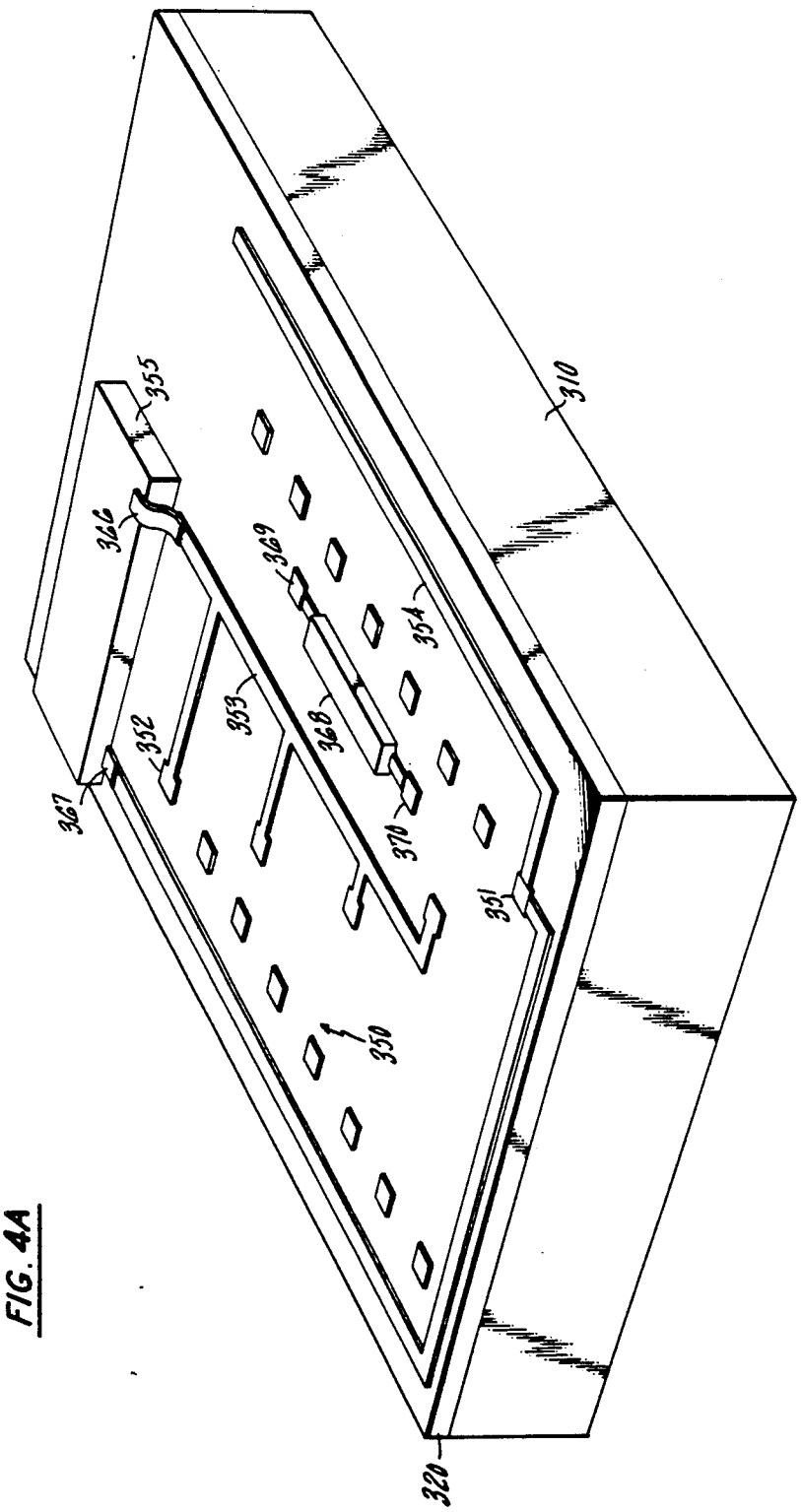

Referring now to FIGS. 4A and 4B, there is shown a variation of a die using the standard pad layout. The standard pad array of FIGS. 3A and 3B used a square outline that was sized to fit on a very small chip, so that a single leadframe could be used for the complete size range. there may be other technical or economic considerations, however, that justify a different pad array (which may still be common to a number of integrated circuits).

For example, FIG. 4A shows a die having the same substrate 310 and polyimide 320 as before, but in which the pad array comprises two rows 350 illustratively of eight pads each, set toward the outside of the chip. With the center clear, there is room for bus 353, which distributes the power supply voltage to various points in the circuit, one of which is a via indicated by the numeral 352 and positioned at one of the array positions to make contact with a lead. Compared with the prior art technique of using thin wires, bus 353 offers considerably less resistance and inductance. Similarly, bus 354 makes contact with pad 351 and distributes the ground terminal about the die.

A further advantage of the sturdy polyimide layer 320 is that discrete electrical devices, active or passive, may be placed on top of layer 320 and connected to the circuit, either by vias or to the standard pads. In FIG. 4A, device 368 is shown as being connected to vias 370 and 369. The device may be a thick-film resistor having a large magnitude (that is difficult to achieve with conventional integrated circuit techniques). It also may be a separately formed device, optionally with conventionally surface-mounted-device packaging. Examples are resistors, inductors and capacitors.

One useful example of a capacitor is shown as unit 355, a charge reserve capacitor connected between the power supply and ground using a conductive adhesive at point 367 and to strap 366. Such capacitors are conventionally attached to integrated-circuit sockets to maintain a stable supply voltage when circuits switch. The economic advantages of including the capacitor with the chip are evident. A device such as unit 355 may be connected to any point in the circuit, of course.

One variation that is of great interest is the use of a separate device 355 that is an optical or other element that is difficult to fabricate on the same substrate. For example, device 355 could be a solid-state laser using a gallium arsenide substrate and die 310 could be a conventional silicon integrated circuit. In that case, a fiber-optic pigtail would be included for communication to other optical devices.

Other devices that may be readily implemented are an R-C timing network, either fixed or having an adjustment element for which an access hole is formed in the encapsulating plastic; or a power transistor using the area of device 355 to spread the heat load. Heat sinks may also be attached directly to layer 320 or to vias that provide a low impedance thermal conduction path from high-power sections of substrate 310.

These other devices may be attached in any convenient manner. They may be adhesively attached before or after the soldering of the leadframe (or they may be soldered and the leadframe adhesively attached). Alternatively, soldering or gluing of leadframe and discrete devices may be done simultaneously, with the leadframe maintained in position prior to bonding by an adhesive.

FIG. 4B illustrates another variation of the invention that offers considerable reduction in inventory. There is now a two-chip assembly comprising a first chip 300' having substrate 310, polyimide 320 and surface pads as before, and a second chip 380 comprising substrate 310', polyimide 320' and array of contacts 382' that mate with an array of contacts 382 on layer 320.

An alternate U-shaped contact array 350' is shown, which has the advantage of freeing up half of layer 320 for chip 380. In order to bring all the leads over to one half of chip 300', it may be necessary to permit some variation in the spring constant of the leads.

Only some connections between contacts 350' and 382 are shown, for power supply and ground. Chip 380 may connect directly to the leads for input/output, of course. In the case illustrated, chip 380 is a ROM that needs only power supply and ground and communicates only with the larger chip through vias in array 382 or through surface leads, such as lead 373.

One particular application of great commercial interest is that of a multi-purpose chip, such as a single-chip microcomputer that is customized by adding a ROM. If the ROM is a mask option, then there must be a reserve supply of customized microcomputers to allow for fluctuations in the yield, or rush orders and the manufacturer must maintain an inventory of chips that are good only for one customer. With the embodiment of FIG. 4B, however, the inventory for each customer need only be his ROMs, which are much cheaper than microcomputers. The manufacturer will maintain a reserve of microcomputer chips sufficient to meet the needs of all his customers, of course. It is evident that the total value of inventory will be less with a central reserve, simply because of the laws of statistics.

A variation of the two-chip system is that in which the main chip 302 is a generalized system, such as an input controller and the second chip 380 is one of a number of alternatives, each customized for a particular application. For example, the main chip might be a 5-volt logic chip and chip 380 might be designed to withstand the high voltages of the telephone network in a telephone interface such as a modem or coder.

Many other applications of the second chip, such as interfaces to different manufacturers' computers for plug-compatible systems; or the implementation of one of a number of standard logical functions, such as a parallel output or a serial output, will be evident to those skilled in the art.

One convenient method of attaching chip 380 is to form pads 382' with a sufficient amount of high temperature solder to make reliable contact and to reflow that bond before bonding the leads at a lower temperature. Another method is to adhesively attach chip 380 in alignment and to solder both sets of contacts simultaneously.

Those skilled in the art will readily be able to devise further alternate embodiments of the invention in the light of this disclosure. In particular, the invention is not confined to any particular configuration of contact pads; square or rectangular arrays may be used; as may U-shaped arrays; rows of lines; or irregular configurations.

We claim:

1. A method of attaching electrical leads to an integrated circuit having a plurality of electrical devices connected in an electrical circuit by a network of electrical conduction paths to a first array of input/output contacts comprising the steps of:
    applying a layer of dielectric over said electrical circuit;
    opening apertures in said layer of dielectric above said first array of input/output contacts;
    applying a network of electrically conductive paths between said first array of input/output contacts and a second array of input/output contacts disposed in a predetermined pattern on said layer of dielectric;
    placing an array of electrically conductive leads having attachments tips in proximity to said second array of input/output contacts; and
    simultaneously forming an electrically conductive bond between at least some of said second array of input/output contacts and at least some of said attachment tips.

2. A method according to claim 1, in which said step of opening apertures in said dielectric includes the steps of applying a sheet of photosensitive material above said layer of dielectric, patterning said photosensitive material with aperture regions and chemically removing that portion of said dielectric below said aperture regions to form said apertures.

3. A method according to claim 1, in which said step of applying a network of electrically conductive paths includes the step of applying a thick-film pattern of conductive material to form said network of electrically conductive paths.

* * * * *